United States Patent [19]

DiGiacomo et al.

[11] Patent Number: 5,266,522
[45] Date of Patent: Nov. 30, 1993

[54] STRUCTURE AND METHOD FOR CORROSION AND STRESS-RESISTANT INTERCONNECTING METALLURGY

[75] Inventors: Giulio DiGiacomo, Hopewell Junction; Armando S. Cammarano, Hyde Park; Nunzio DiPaolo, Poughkeepsie, all of N.Y.

[73] Assignee: International Business Machines Corporation, Armonk, N.Y.

[21] Appl. No.: 894,384

[22] Filed: Jun. 5, 1992

Related U.S. Application Data

[62] Division of Ser. No. 683,169, Apr. 10, 1991, Pat. No. 5,175,609.

[51] Int. Cl.$^5$ .............................................. H01L 21/44
[52] U.S. Cl. .................................... 437/192; 437/189; 437/193; 437/200
[58] Field of Search ............... 437/192, 193, 200, 189, 437/182, 183, 190, 201

[56] References Cited

U.S. PATENT DOCUMENTS

| | | | |
|---|---|---|---|
| Re. 27,934 | 5/1974 | Merrin et al. | 317/101 CC |
| 3,977,840 | 8/1976 | Estep et al. | 29/195 |
| 4,164,607 | 8/1979 | Thiel et al. | 428/621 |
| 4,176,443 | 12/1979 | Iannuzzi et al. | 29/589 |
| 4,463,059 | 6/1984 | Bhattacharya et al. | 428/620 |
| 4,480,261 | 10/1984 | Hattori et al. | 357/71 |
| 4,503,131 | 3/1985 | Baudrand | 428/672 |
| 4,563,399 | 1/1986 | Wright, Jr. | 428/626 |
| 4,634,638 | 1/1987 | Ainslie et al. | 428/671 |
| 4,651,191 | 3/1987 | Ooue et al. | 357/71 |
| 4,675,243 | 6/1987 | Obinata et al. | 428/210 |
| 4,772,523 | 9/1988 | Mace et al. | 428/630 |
| 4,880,684 | 11/1989 | Boss et al. | 428/209 |
| 4,923,827 | 5/1990 | Calviello et al. | 437/192 |
| 4,963,512 | 10/1990 | Iwanaga et al. | 437/192 |
| 4,970,570 | 11/1990 | Agarwala et al. | 357/68 |
| 4,983,250 | 1/1991 | Pan | 437/192 |
| 4,985,310 | 1/1991 | Agarwala et al. | 428/620 |
| 5,057,454 | 10/1991 | Yoshida et al. | 437/192 |
| 5,059,553 | 10/1991 | Berndlmainer et al. | 437/192 |
| 5,122,477 | 6/1992 | Wolters et al. | 437/192 |

FOREIGN PATENT DOCUMENTS 59-48941 2/1984 Japan.
59-32154 3/1984 Japan.

OTHER PUBLICATIONS

"Backside Preparation and Metallization of Silicon Wafers for Die-Bonding," Research Disclosure, No. 267 (Jul. 1986).

*Primary Examiner*—Brian E. Hearn
*Assistant Examiner*—Kevin M. Picardat
*Attorney, Agent, or Firm*—Aziz M. Ahsan

[57] ABSTRACT

This invention relates generally to structure and method for corrosion- and stress-resistant interconnecting metallurgy, and more specifically to new structures and methods for corrosion- and stress-resistant interconnecting multilayer metallurgical pad comprising sequentially deposited layers of chromium, nickel and noble or relatively noble metal as the interconnecting metallurgy, or multilayer metallurgical pad comprising sequentially deposited layers of chromium, soluble noble metal, nickel and noble or relatively noble metal as the interconnecting metallurgy. This invention also relates to an improved multilayer metallurgical pad or metallurgical structure for mating at least a portion of a pin or a connector or a wire to a substrate.

25 Claims, 3 Drawing Sheets

STRUCTURE AND METHOD FOR CORROSION AND STRESS-RESISTANT INTERCONNECTING METALLURGY

This Patent Application is a Division of U.S. Pat. application Ser. No. 07/683,169, filed on Apr. 10, 1991, now U.S. Pat. No. 5,175,609.

FIELD OF THE INVENTION

This invention relates generally to structure and method for corrosion- and stress-resistant interconnecting metallurgy, and more specifically to new structures and methods for corrosion- and stress-resistant interconnecting multilayer metallurgical pad comprising sequentially deposited layers of chromium, nickel and noble or relatively noble metal as the interconnecting metallurgy, or multilayer metallurgical pad comprising sequentially deposited layers of chromium, soluble noble metal, nickel and noble or relatively noble metal as the interconnecting metallurgy. This invention also relates to an improved multilayer metallurgical pad or metallurgical structure for mating at least a portion of a pin or a connector or a wire to a substrate.

BACKGROUND OF THE INVENTION

On one of the surfaces of a semiconductor component, such as a chip, there is an arrangement of pads, each with a solder ball (hereinafter referred to as C-4 solder ball pads or just C-4s) which are adapted to provide connection between the chip and a substrate, such as a ceramic substrate. This is done by means of bonding of the solder balls which are heated to a temperature above the melting temperature of the solder balls thereby permitting solder bonding of the solder balls to pads carried on the mating surface of the substrate. Connected between the solder pad areas and other sites on or in the substrate are so-called fan-out lines which extend along the mating surface of the substrate beneath a layer of insulation. At certain locations on the surface of the substrate, it is necessary to make pads available for engineering change (EC) wiring to be connected to the fan-out metallurgy. The engineering change wiring, however, is usually connected to the pads by the process of wire bonding, either by ultrasonic vibration or by thermo-compression techniques, or by solder bonding. The metallurgical requirements for solder bonding as contrasted with the requirements for wire bonding techniques differ.

In Bhattacharya et al. U.S. Pat. No. 4,463,059, the metallurgical requirements for solder bonding and wire bonding were discussed in the context of the top surface metallurgy of a ceramic substrate. Several metallurgical structures were proposed. For solder bonding, one proposed structure consisted of fan-out lines of chromium and gold, then a barrier layer of cobalt or chromium over the gold followed by a top layer of nickel or copper. For wire bonding, the nickel or copper top layer was eliminated. In other structures, Bhattacharya et al. suggested the use of gold where solder bonding was to occur.

Merrin et al. U.S. Pat. Re. 27,934 discussed the requirements of ball limiting metallurgy (BLM), i.e., the pads on the bottom of the chip which serve to limit the flow of the solder balls upon heating. The particular ball limiting metallurgy proposed by Merrin et al. comprises subsequent layers of chromium, copper and then gold.

Similarly, Research Disclosure 26726, Number 267, (July 1986), discloses a backside preparation and metallization of silicon wafers for die-bonding comprising coating the backside of a semiconductor chip with subsequent layers of chromium or titanium, nickel or copper followed by a top layer of gold, and which is followed by a coating of tin.

U.S. Pat. No. 4,772,523 (Mace et al.), discloses a composite metallization structure on a glass substrate consisting of Cr/Au/Ni/Au/solder layers for a silicon capacitive pressure sensor. The interm gold layer does not bond strongly to chromium because of a lack of mutual solubility, but it appears that the interm gold layer will diffuse into the grain boundaries of the nickel and chrome metallization layer during the anodic bonding process. This anodic bonding process is done prior to the solder application, and the composite metallization layers are subjected to anodic-bonding temperatures under an electric potential to diffuse gold into nickel and chromium.

The present day top surface metallurgy for ceramic substrates may comprise a multilayered metallurgical structure of chromium or titanium, copper and then gold or, alternatively, molybdenum, nickel and then gold. The currently favored ball limiting metallurgy comprises chromium, copper and gold. Both the top surface metallurgy (hereinafter TSM) and the ball limiting metallurgy (hereinafter BLM) undergo many solder reflow operations during the process of joining the chips to the ceramic substrate. The gold in the TSM and BLM quickly dissolves in the solder, leaving the underlying copper (or nickel) to react with the solder which is usually of a lead/tin composition. The solder and the underlying copper (or nickel) have been chosen because they form a good solder joint.

The reaction of the copper and the solder, however, causes the formation of copper/tin intermetallics. Ordinarily, this would not be a problem but due to the multiple solder reflows necessary to join the chips to the ceramic substrate, the copper/tin intermetallics, eventually build up to the point where they spall off the underlying metallization, resulting in the loss of BLM conduction as well as the loss of a reaction barrier between the solder and the underlying chip metallization. Further, the spalling of these intermetallics can lead to early failure of the solder joint.

It would thus be an important step to be able to eliminate copper/tin intermetallics and their accompanying problems, and to be able to provide corrosion and stress-resistant interconnecting metallurgy.

OBJECTS AND SUMMARY OF THE INVENTION

It is an object of the invention to have an improved joint between electronic components which is not as susceptible to excessive formation of intermetallics and their accompanying problems.

It is another object of the invention to have an improved joint between electronic components comprising a metallurgical structure which has a reduced rate of reaction with solder.

It is yet another object of the invention to have an improved joint between electronic components after multiple solder reflows.

Still another object of this invention is to provide an interconnecting metallurgy which provides:

(a) low enough stresses, that the substrate does not crack, (b) is sufficiently noble, so that corrosion in field environment does not cause intolerable fails, (c) adheres to the substrate, such that, it will not separate under the process and field stresses, and (d) be wettable by braze and solder, and must react with them to form a strong metallurgical bond by solid solution and/or intermetallics formation.

According to one aspect of the invention there is disclosed a multilayered interconnecting metallurgical structure for an electronic component comprising, a pad over a substrate, wherein the pad comprises sequentially formed layers of chromium, soluble noble metal, nickel and a noble or relatively noble metal.

According to another aspect of the invention there is disclosed a multilayered interconnecting metallurgical structure for an electronic component comprising, a pad over a substrate, wherein the pad comprises sequentially formed layers of chromium, nickel and a noble or relatively noble metal.

According to still another aspect of the invention, there is disclosed a method for forming a multilayered interconnecting metallurgical pad for an electronic component comprising the steps of:

a) depositing a layer of chromium directly on the electronic component, b) depositing a layer of soluble noble metal on the layer of chromium, c) depositing a layer of nickel directly on the layer of soluble noble metal, and d) depositing a layer of noble or relatively noble metal directly on the layer of nickel, thereby forming the multilayered interconnecting metallurgical pad.

According to yet another aspect of the invention, there is disclosed a method for forming a multilayered interconnecting metallurgical pad for an electronic component comprising the steps of:

a) depositing a layer of chromium directly on the electronic component, b) depositing a layer of nickel directly on the layer of soluble noble metal, and c) depositing a layer of noble or relatively noble metal directly on the layer of nickel, thereby forming the multilayered interconnecting metallurgical pad.

These and other objects and aspects of the invention will become more apparent after referring to the following description considered in conjunction with the accompanying drawings.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION OF THE INVENTION

It has been discovered that the Ni or Ni/Pt combination according to this invention reduces the stress, almost eliminates corrosion, provides a very good TCE (Thermal Coefficient of Expansion), and there is no pull-strength degradation. Therefore, the basic invention is to replace the copper layer with either a Ni layer or a Pt/Ni combination layer in the pads, such as capture pads, EC pads, I/0 pads, etc. This invention can be used with any type of a substrate.

Any surface mountable item, such as pins, flexible connector, pad-on-pad connector can also be successfully connected to this new metallurgy.

Figure 7:
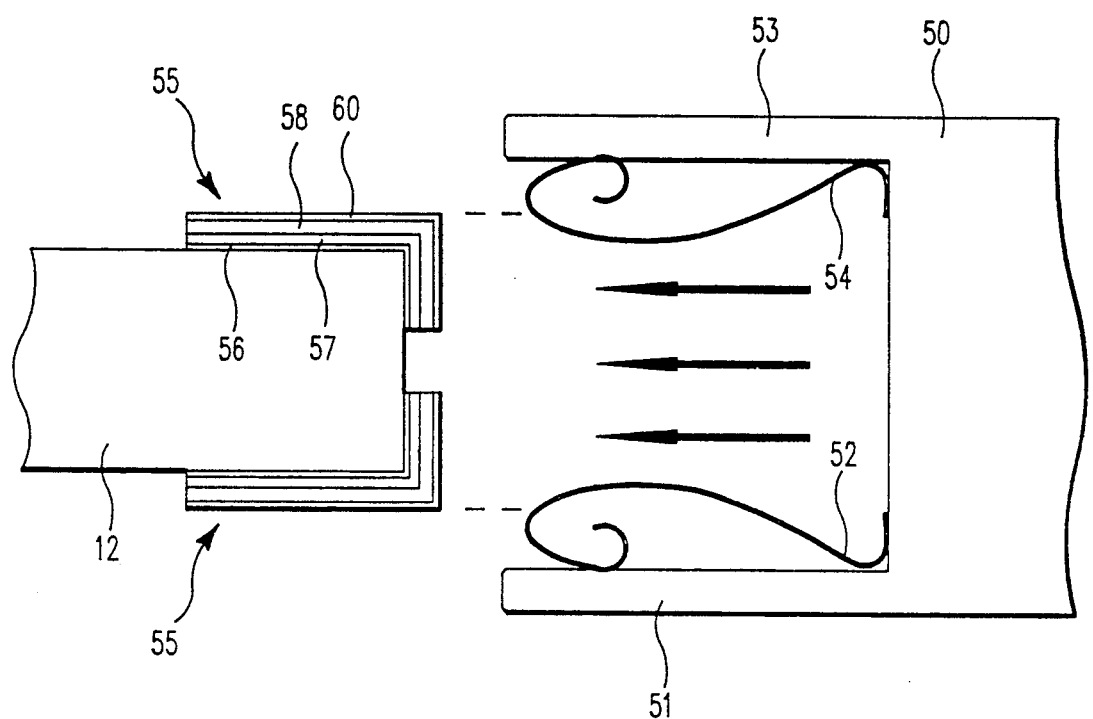
FIG. 7 is yet another embodiment of the invention where an edge connector is secured to a substrate having multilayered metallurgical edge connection.

This new metallurgy can also be used for edge connector applications as illustrated in FIG. 7.

Figure 1:
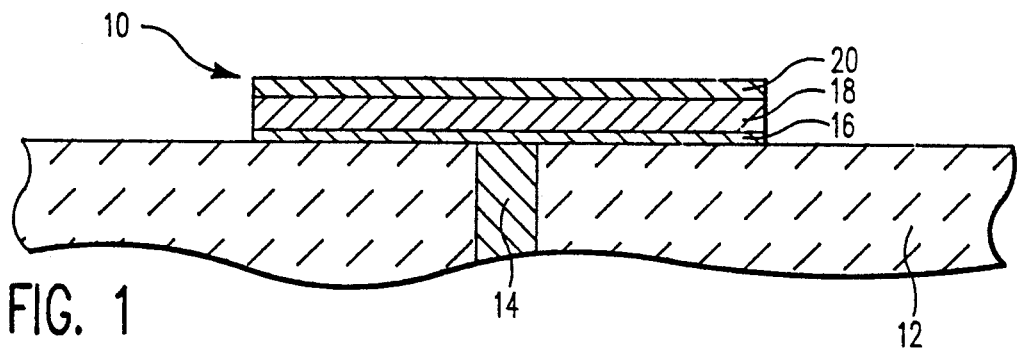
FIG. 1 is a cross-sectional view of a multilayered metallurgical structure according to one aspect of the invention.

Referring to the Figures in more detail and particularly referring to FIG. 1, there is shown a multilayered metallurgical structure or pad, generally indicated by 10, for an electronic component, 12. The electronic component 12, can be a silicon device, such as a semiconductor chip, or a substrate, such as a ceramic substrate. For the ease of understanding this invention the electronic component 12, will hereinafter be referred to as substrate 12. The substrate or electronic component 12, has at least one via connection 14. On one of the surfaces of the substrate 12, can be a layer of wiring metallurgy (not shown). By way of illustration and not limitation, the wiring metallurgy may be an aluminum/copper alloy, aluminum, copper, gold, or any suitable electrically conductive material. The multilayer metallurgical structure 10, can be a ball limiting metallurgy (BLM), pin braze pad, C4 pad, etc.

FIG. 1, shows the basic metal film structure deposited on the substrate 12. The layers or films are deposited sequentially within a vacuum system (without breaking the vacuum) by chemical vapor deposition, etching, evaporation, sputtering, or by any other suitable technique. A layer of chromium 16, is first deposited so that it contacts at least a portion of at least one via connection 14. In some cases the chromium layer 16, may have to contact two or more via connections 14. A layer of nickel 18, is deposited on the chromium layer 16, and finally, a layer of noble or relatively noble metal 20, is deposited on the nickel layer 18. These deposited layers are then typically formed into an array of pads. These pads can now be used to connect various components such as wires, pins, connectors etc.

Figure 2:
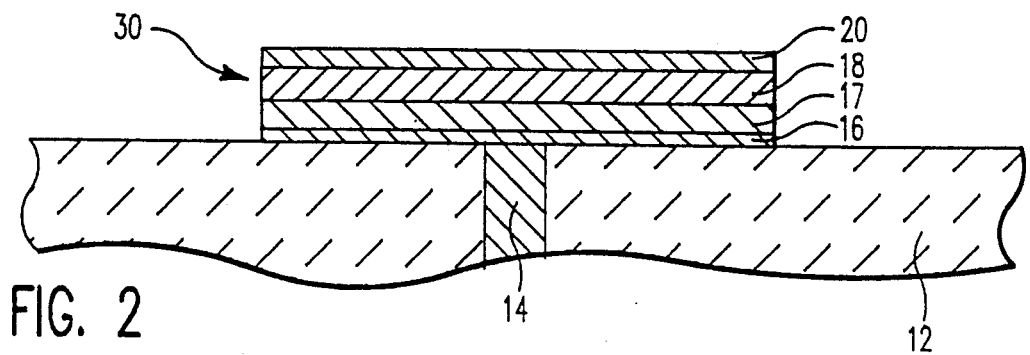
FIG. 2 is a cross-sectional view of another embodiment of a multilayered metallurgical structure according to the invention.

The second embodiment of a multilayered metallurgical structure or pad is shown in FIG. 2, and is generally indicated by 30. The electronic component or substrate 12, as stated earlier can be a semiconductor chip or a multilayered ceramic substrate. Within the substrate 12, there are one or more via connections 14, for communicating between the wiring in the various layers (not shown) of the substrate 12, and other electronic components that may be joined to the substrate 12. A chromium layer 16, is deposited directly on the substrate 12, so that it is electrically in contact with at least one via connection 14. This is followed by a layer of soluble noble metal 17, deposited directly on the layer of chromium 16. Next a layer of nickel 18, is deposited, and, finally, a layer of noble or relatively noble metal layer 20, is deposited on the nickel layer 18.

The particular application will determine the variation and/or the thickness of the metallurgy that is most suitable and economical for forming the multilayered metallurgical pad 10 or 30.

It should be understood that noble or relatively noble metal, and hereinafter referred to as noble metal, means those metals and alloys that have a reduced tendency to oxidize in air. Included within this definition are true noble metals such as gold, platinum and palladium, and also other metals having a reduced tendency to oxidize in air such as tin. The noble or relatively noble metal is selected from the group consisting of gold, palladium, platinum, rhodium, tin and mixtures thereof. The use of the term noble metal shall hereinafter encompass noble as well as relatively noble metals.

A soluble noble metal is defined as a noble metal (corrosion resistant) which has significant solubility with chromium to produce a strong bond. The soluble noble metals are palladium, platinum, and rhodium. The soluble noble metal layer is selected from the group consisting of palladium, platinum, rhodium and mixtures thereof.

It is preferred that the noble or relatively noble metal layer 20, be gold, but alternatively could also be platinum, palladium, rhodium or tin. Similarly, it is preferred that the soluble noble metal layer 17, be platinum, but alternatively could also be palladium or rhodium.

It is further preferred that the chromium layer 16, has a thickness from 0.01 to 0.3 micron, the soluble noble metal layer 17, has a thickness from 0.02 to 5.0 micron, the nickel layer 18, has a thickness from 1.0 to 5.0 micron, and the noble or relatively noble metal layer 20, has a thickness from 0.1 to 20.0 micron. In some cases where the soluble noble metal layer is not used then it is preferred that the chromium layer 16, has a thickness from 0.01 to 0.3 micron, the nickel layer 18, has a thickness from 1.0 to 5.0 micron, and the noble or relatively noble metal layer 20, has a thickness from 0.1 to 20.0 micron.

Chromium and nickel layers are an important ingredient of the invention for several reasons. First, chromium layer 16, forms a strong bond with either the nickel layer 18, or the soluble noble metal layer 17. Thus, the separation of the chromium from either of the nickel or the soluble noble metal would not occur. Additionally, and perhaps most importantly, the nickel layer 18, has limited reactivity with the solder. This reactivity is considerably less than that for copper. Thus the nickel layer 18, can undergo multiple solder reflows without exhibiting any deleterious qualities such as spalling.

Therefore, the chromium layer 16, is there to ensure adhesion to the substrate 12. The soluble noble metal layer 17, such as platinum, is there as stress-reducer and because of its high resistance to corrosion and chemical compatibility and solubility with the other metals, which is a key requirement for most applications. The nickel layer 18, is there for its reaction-controlling properties and strong intermetallic bonding which must persist with undiminished effectiveness during the joining process. The noble metal layer 20, such as gold, is to protect the surface and preserve the wettability of the braze/solder, and to make possible wire bonding by ultrasonics, pressure bonding, microwelding, etc.

Figure 3:
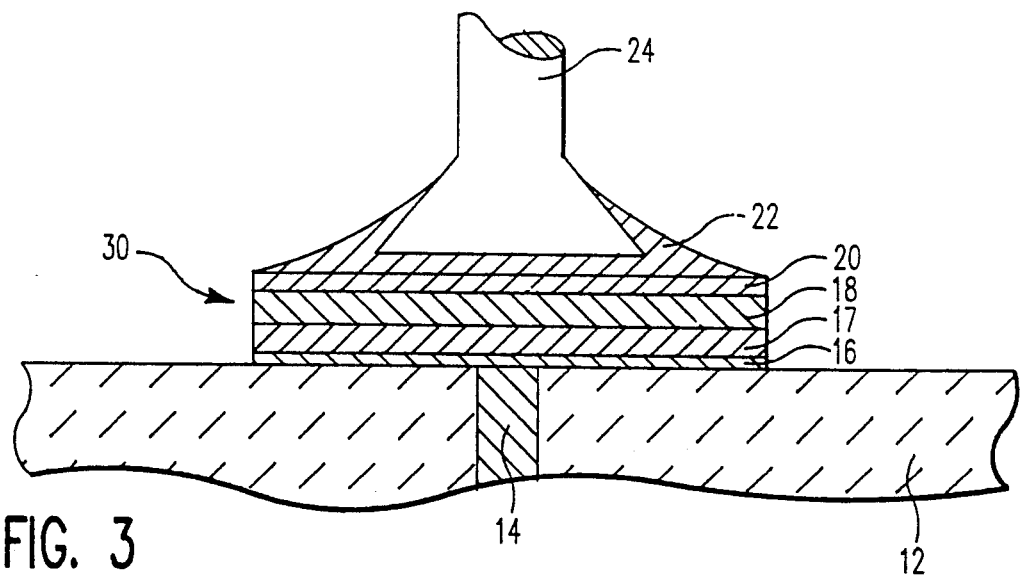
FIG. 3 shows a pin connected to the multilayered metallurgical structure of FIG. 2.

The multilayered metallurgical pad 10 or 30, that is formed may serve the purpose of a pad for joining with a pin 24, using solder or braze 22, as shown in FIG. 3. At least a portion of the noble or relatively noble metal layer is in contact with a solder material. The structure shown in FIG. 3, may be formed in a number of ways, but one particular way is to first deposit a layer of insulating material (not shown), for example, a polyimide, over the substrate 12, as described in Boss et al., U.S. Pat. No. 4,880,684, the disclosure of which is incorporated herein by reference. By photolithography, or etching or laser ablation the polyimide is removed in the area over via 14, fully exposing the metallurgy of the via 14. Thereafter, the multilayer metallurgical structure or pad 10 or 30, is deposited as discussed earlier. The multilayered metallurgy that is deposited over the at least one via 14, is similar to the structure shown in FIG. 1 and FIG. 2. A layer of chromium 16, is deposited on the via 14, followed by a layer of soluble noble metal 17, and a layer of nickel 18, and finally a layer of noble or relatively noble metal 20, preferably gold, which is deposited directly on the layer of nickel 18. The pin 24, is then secured to the solder or braze 22, as disclosed by methods well known in the art, such as U.S. Pat. No. 4,970,570 (Agarwala, et al.), the disclosure of which is incorporated herein by reference.

If a solder ball (not shown) is used to secure to the solder 22, instead of the pin 24, then the multilayer metallurgical structure 10 or 30, and substrate 12, are heated to cause the solder 22, to melt and flow as taught by the Merrin et al, U.S. Pat. No. Re. 27,934.

In practice if the multilayer metallurgical structure or pad 10 or 30, was to come in contact with solder, the noble metal layer 20, would dissolve into the solder during the reflow operation. Accordingly, the noble metal layer 20, would be fugitive. On the other hand, if the multilayer metallurgical structure 10 or 30, was only to undergo wire bonding, where soldering was not to occur, then noble metal layer 20, would remain substantially in place.

An unexpected advantage of the noble metal layer 20, is that the noble metal forms a thin layer of intermetallic that is adherent with the braze or solder 22, and the underlying nickel layer 18. During reflow and rework operations, this intermetallic remains wettable by the solder so that fluxing is not required.

During the reflow operation, the noble metal layer 20, becomes absorbed within the solder 22, and thus is considered to be a fugitive layer. The importance of the noble metal layer resides in the fact that it prevents the underlying nickel layer from oxidizing during storage, and therefore allowing it to wet and react with the solder.

Figure 4:
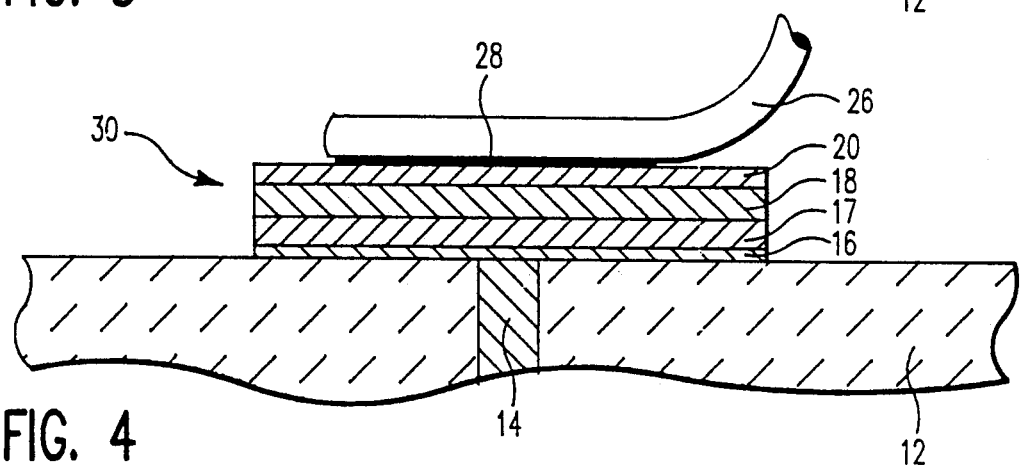
FIG. 4 shows a wire connected to the multilayered metallurgical structure of FIG. 2.

Alternatively, the multilayer metallurgical pad may serve the purpose of a wire bonding site for an engineering change pad in which case the TSM may not come in contact with solder. For example, wire bonding may be done by ultrasonic vibration or thermo-compression, in which case, solder is not used. An example of the application of the pad as a wire-bonding site is shown in FIG. 4. Here at least a portion of the wire 26, is attached to at least a portion of the pad structure (shown in FIG. 2) by the bonding technique which is most suitable for the application, such as ultrasonics, pressure bonding, microweld, etc. This bonding will result in a diffusion zone 28.

The thickness of the noble metal layer 20, such as gold, will vary depending on the bonding technique employed, i.e., for ultrasonic bonding, thick gold would be required. Because of the wire 26, larger thermal expansion coefficient relative to the substrate 12, high shear stresses are induced to the metals and metal/substrate interface and outer boundaries. Again, chromium and platinum provide both the adhesion and stress reduction respectively, gold the bonding capacity, and nickel the reaction control especially for microwelding.

As illustrated so far, the multilayer metallurgical structure of this invention has the required properties of low stress, minimal corrosion, strong adhesion to the substrate (ceramics, polymers, etc.) and reactability with brazes and solders in a wide range of applications. Each layer is there for a specific purpose. There may be applications where the corrosion and mechanical requirements may not be so stringent and the soluble noble metal layer 17, between the chromium layer 16, and the nickel layer 18, may not be needed and could be left out, as shown in FIG. 1. On the other hand, there may be applications in which the substrate is very brittle and susceptible to cracking, in which case the multilayer metallurgical structure may be too stressful if deposited directly on the substrate. In such a case, a polymeric film, i.e. polyimide, can be deposited between the metallurgy and the substrate as a cushion to absorb most of the film and/or braze induced stress, preventing their transmission to the substrate.

Figure 5:
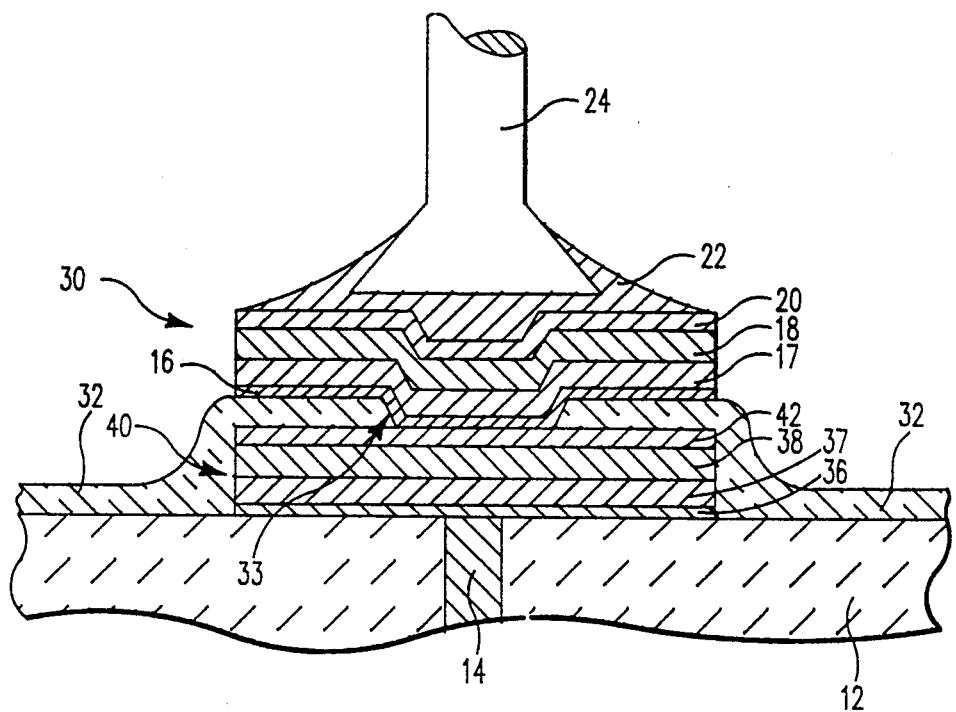
FIG. 5 is another embodiment of the invention where a pin is attached to a base metallurgical pad on a substrate using the multilayered metallurgical structure of this invention.

FIG. 5 illustrates an example of the metallurgy deposited on a substrate 12, having a layer or film of an insulator 32, such as a polymer film, which attenuates the stress produced by a pin 24, attached to it by braze or solder 22. The via 14, in the substrate 12, is in electrical contact with a base metallurgy 40. The structure of this invention can be on a base metallurgy, and, wherein the material for the base metallurgy is selected from the group consisting of aluminum, chromium, cobalt, copper, hafnium, molybdenum nickel, niobium, tantalum, titanium, zirconium, noble metals and mixtures thereof. The base metallurgy 40, consists of a first chromium layer 36, a noble metal layer 37, a nickel layer 38, and a second chromium layer 42. The insulator 32, has an ablated via 33, which allows the connection between the multilayer metallurgical structure and the base metallurgy 40, which can be Cr/Pt/Ni/Cr. The layer or film of insulator 32, such as glass, quartz, silicon nitride, silicon oxynitride or organic insulators such as polyimide (hereinafter just insulator) is deposited over the second chromium layer 42. The insulator 32, is etched through to provide contact with the base metallurgy 40. The walls of the ablated via 33, of the insulator 32, provide a containment area for the ball limiting metallurgy to be deposited subsequently. The chromium layers 36 and 42, are there for adhesion to both the substrate 12, and the insulator 32. Again, in this substrate metallurgy, the noble metal layer 37, such as a platinum layer, is used as stress reducer as well as corrosion barrier, while chromium satisfies the adhesion requirement for both the insulator and the substrate. If the substrate has high strength, one need not use the insulator 32, and the base metallurgy 40, and can attach the pin directly to the film-structure as illustrated in FIG. 1 or FIG. 2, by solder or braze (direct-attach). The pad 30, is then deposited on the base metallurgy 40, by methods discussed earlier and the pin 24, can then be attached to the pad 30, via the solder or braze 22.

Figure 6:
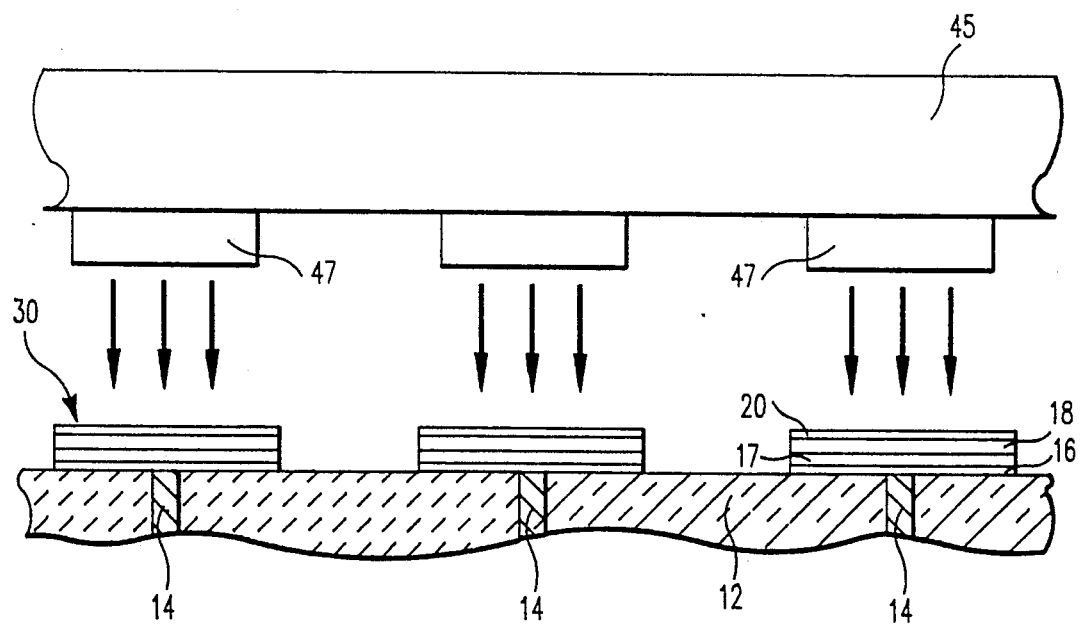
FIG. 6 is still another embodiment of the invention where a connector having metal pads is being secured to a substrate which has the multilayered metallurgical structure of this invention.

Another application of this invention is illustrated in FIG. 6, which is an example of pad-on-pad connector. A rigid or flexible connector 45, having metal pads 47, is made to contact the substrate 12, having pads 10 or 30. In most situations the metal pads 47, have a corresponding pad 10 or 30, and vice versa. No metallurgical bond between the two pad surfaces is formed, i.e., between pads 47, and pads 10 or 30. The electrical contact between the pads 10 or 30 and 47, is maintained under adequate pressure, achieved through the flexibility of the connector or individual pads. The pad surfaces that come in physical contact must be noble so that oxidation does not occur, which would eventually produce high unacceptable electric contact-resistance. The connectors can be pad-on-pad, edge connectors or other types, all requiring mechanical and corrosion stability provided by the disclosed metallurgy. The mechanical aspect can be severe because connectors are often flat flexible cables constructed of polymeric and metallic layered composite structures (i.e., kapton/Cu), which have relatively high thermal expansion coefficients compared to the ceramic substrates and which induce high shear stresses to the connecting pads.

An example of using the multilayered metallurgical interconnection of this invention as an edge connector is illustrated in FIG. 7. By methods well known in the art the substrate 12, has edge pads 55, formed on the edges of the substrate 12. The edge pad 55, could have the multilayered metallurgy of either pad 10 or pad 30. In FIG. 7, the multilayered metallurgy of pad 30, is shown, where the edge pad 55, is comprised of sequentially deposited layers of chromium 56, soluble noble metal layer 57, nickel layer 58, and a layer of noble metal 60. Preferably, the soluble noble metal layer 57, is platinum, and the noble metal 60, is gold. An edge connector 50, having extensions 51 and 53, to accommodate springs 52 and 54, receives the edge of the substrate 12, so that at least a portion of the pad 55, makes an electrical connection with at least a portion of the edge connector 50.

The BLM metallurgy of this invention has shown extremely good results. The BLM that is currently used in some cases has been shown to be highly susceptible to chlorine induced corrosion in repeated evaluations. This invention has also changed the capture pad metallurgy, i.e., that once the I/O pad were removed as the weak link, the current capture pads also emerged as having corrosion related problems. The change to a nickel based system for both the I/O and capture pads has given a metallurgy that is corrosion resistant with no degradation in pull strengths.

This invention is applicable in arts such as processing where it can be employed in manufacturing semiconductor products for personal computers, minicomputers, large scale computers and other processing equipment. In particular, this process is applicable to the manufacture of VLSI chips for industrial and consumer electronic devices. Electronic products such as transportation and control systems incorporating processing systems for continuous monitoring and like functions can use products made by use of this invention.

The advantages of the present invention will become more apparent after referring to the following examples.

EXAMPLES

The following examples are intended to further illustrate the invention and are not intended to limit the scope of the invention in any manner.

EXAMPLE 1

On a standard substrate a pad structure of this invention was formed on a base metallurgy. The base metallurgy was 300Å Cr/5,000Å Pt/15,000Å Ni/ 300Å Cr, as shown in FIG. 5, and the structure for the pad was 300Å Cr/5,000Å Pt/15,000Å Ni/5,000Å Au. This metallurgical structure was evaporated under standard conditions and with the use of conventional tooling. The structure that was formed offered strong-resistance to corrosion and to the degradation of the joints strength. The dual structure having the base metallurgy and the pad was tested. After 140 hours in 85° C., with 81 percent relative humidity and chloride level of 0.30 microgram/cm$^2$, no corrosion and no significant pull-strength degradation was observed. According to the results thus far obtained, the metallurgy system solves the problem in terms of corrosion and strength without compromising other properties or introducing new problems of its own.

As can be seen that good results were obtained not only with the pad and the base metallurgical structure in a temperature-humidity environment, but also in the same environment with a chloride contamination at a level of 0.30 microgram/cm$^2$. These results represent a significant improvement over the current metallurgy with regard to corrosion resistance.

EXAMPLE

A number of substrates have been prepared and tested to determine metal thickness windows. It has been shown that one micron layer of nickel is adequate to withstand six reflows without virtually any change in the strength and failure mode, though thicker nickel can be used in the I/O metallurgy if desired. In the base metallurgy, 2.5 micron nickel has given no indication of cracking and has produced no fails in the metallurgy and the braze/joint, after the tensile/pull test. Even after 11 reflows there were no fails in the braze/metallurgy at a 5 lbs. pull-strength criteria. The thicknesses of the platinum and nickel were varied with consistently good results.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method for forming a multilayered interconnecting metallurgical pad for making an electrical contact with an electronic component comprising the steps of:
   a) depositing a layer of chromium directly on said electronic component,
   b) depositing a layer of soluble noble metal on said layer of chromium,
   c) depositing a layer of nickel directly on said layer of soluble noble metal, and
   d) depositing a layer of noble or relatively noble metal directly on said layer of nickel, thereby forming said multilayered interconnecting metallurgical pad.

2. The method of claim 1, wherein said soluble noble metal layer is selected from the group consisting of platinum, palladium, rhodium and mixtures thereof.

3. The method of claim 1, wherein said noble or relatively noble metal is selected from the group consisting of gold, platinum, palladium, rhodium, tin and mixtures thereof.

4. The method of claim 1, wherein said electronic component is a semiconductor chip.

5. The method of claim 1, wherein said electronic component is a ceramic substrate.

6. The method of claim 1, wherein at least a portion of said noble or relatively noble metal layer is in contact with a solder material.

7. The method of claim 1, wherein at least a portion of said pad makes an electrical contact with at least a portion of a connecting device.

8. The method of claim 7, wherein said connecting device is selected from a group comprising a wire, a base metallurgical pad, a pin, a solder ball or a connector.

9. The method of claim 8, wherein said base metallurgical pad has at least one metal, and where said metal is selected from the group consisting of chromium, cobalt, copper, hafnium, molybdenum nickel, niobium, tantalum, titanium, zirconium, noble metals and mixtures thereof.

10. The method of claim 1, wherein the process for the formation of said pad is selected from a group comprising, chemical vapor deposition, etching, evaporation or sputter deposition.

11. The method of claim 1, wherein said chromium layer has a thickness from 0.01 to 0.3 micron, said soluble noble metal layer has a thickness from 0.02 to 5.0 micron, said nickel layer has a thickness from 1.0 to 5.0 micron, and said noble or relatively noble metal layer has a thickness from 0.1 to 20.0 micron.

12. The method of claim 1, wherein said electronic component has at least one via.

13. The method of claim 12, wherein at least a portion of said layer of chromium makes electrical contact with at least a portion of at least one of said via.

14. A method for forming a multilayered interconnecting metallurgical pad for making an electrical contact with an electronic component comprising the steps of:
   (a) depositing a layer of chromium directly on said electronic component,
   b) depositing a layer of nickel directly on said layer of chromium, and
   c) depositing a layer of noble or relatively noble metal directly on said layer of nickel, thereby forming said multilayered interconnecting metallurgical pad.

15. The method of claim 14, wherein said noble or relatively noble metal is selected from the group consisting of gold, platinum, palladium, rhodium, tin and mixtures thereof.

16. The method of claim 14, wherein said electronic component is a semiconductor chip.

17. The method of claim 14, wherein said electronic component is a ceramic substrate.

18. The method of claim 14, wherein at least a portion of said noble or relatively noble metal layer is in contact with a solder material.

19. The method of claim 14, wherein at least a portion of said pad makes an electrical contact with at least a portion of a connecting device.

20. The method of claim 19, wherein said connecting device is selected from a group comprising a wire, a base metallurgical pad, a pin, a solder ball or a connector.

21. The method of claim 20, wherein said base metallurgical pad has at least one metal, and where said metal is selected from the group consisting of chromium, cobalt, copper, hafnium, molybdenum nickel, niobium, tantalum, titanium, zirconium, noble metals and mixtures thereof.

22. The method of claim 14, wherein the process for the formation of said pad is selected from a group comprising, chemical vapor deposition, etching, evaporation or sputter deposition.

23. The method of claim 14, wherein said chromium layer has a thickness from 0.01 to 0.3 micron, said nickel layer has a thickness from 1.0 to 5.0 micron, and said noble or relatively noble metal layer has a thickness from 0.1 to 20.0 micron.

24. The method of claim 14, wherein said electronic component has at least one via.

25. The method of claim 24, wherein at least a portion of said layer of chromium makes electrical contact with at least a portion of at least one of said via.

* * * * *